(12) United States Patent
Hershenson et al.

(10) Patent No.: US 7,065,727 B2
(45) Date of Patent: Jun. 20, 2006

(54) OPTIMAL SIMULTANEOUS DESIGN AND FLOORPLANNING OF INTEGRATED CIRCUIT

(75) Inventors: Mar Hershenson, Los Altos, CA (US); Arash Hassibi, Mountain View, CA (US); Andre Hentz, Mountain View, CA (US); Stephen Boyd, Stanford, CA (US)

(73) Assignee: Barcelona Design, Inc., Mountain View, CA (US)

( * ) Notice: Subject to any disclaimer, the term of this patent is extended or adjusted under 35 U.S.C. 154(b) by 195 days.

(21) Appl. No.: 09/843,486

(22) Filed: Apr. 25, 2001

(65) Prior Publication Data

US 2002/0184603 A1 Dec. 5, 2002

(51) Int. Cl.
*G06F 9/45* (2006.01)

(52) U.S. Cl. ..................... 716/8; 716/2; 716/7
(58) Field of Classification Search .............. 716/1, 716/2, 7–11, 17, 18
See application file for complete search history.

(56) References Cited

U.S. PATENT DOCUMENTS

| | | | |
|---|---|---|---|
| 4,827,428 A | | 5/1989 | Dunlop et al. |
| 4,918,614 A | * | 4/1990 | Modarres et al. ............. 716/10 |
| 5,055,716 A | | 10/1991 | El Gamel |
| 5,289,021 A | | 2/1994 | El Gamel |
| 5,633,807 A | | 5/1997 | Fishburn et al. |
| 5,754,826 A | | 5/1998 | Gamal et al. |
| 6,002,860 A | | 12/1999 | Voinigescu et al. |
| 6,182,272 B1 | * | 1/2001 | Andreev et al. ............. 716/115 |
| 6,209,119 B1 | * | 3/2001 | Fukui ............................ 716/2 |
| 6,223,334 B1 | * | 4/2001 | Suaris et al. .................. 716/12 |
| 6,269,277 B1 | * | 7/2001 | Hershenson et al. ........... 716/1 |
| 6,272,668 B1 | * | 8/2001 | Teene ........................... 716/10 |
| 6,282,694 B1 | * | 8/2001 | Cheng et al. .................. 716/10 |
| 6,295,633 B1 | * | 9/2001 | Murakawa ..................... 716/8 |
| 6,311,145 B1 | * | 10/2001 | Hershenson et al. .......... 716/11 |
| 6,311,315 B1 | | 10/2001 | Tamaki |
| 6,321,186 B1 | * | 11/2001 | Yuan et al. ..................... 716/5 |
| 6,539,533 B1 | | 3/2003 | Brown, III et al. |
| 6,574,786 B1 | | 6/2003 | Pohlenz et al. |
| 6,578,179 B1 | | 6/2003 | Shirotori et al. |
| 6,581,188 B1 | | 6/2003 | Hosomi et al. |

FOREIGN PATENT DOCUMENTS

WO     WO 01/37429 A1     5/2001

OTHER PUBLICATIONS

Hershenson, Maria Del Mar, et al, "Optimization of Inductor Circuits via Geometric Programming," Electrical Engineering Department, Stanford University.

Mohan, Sunderarajan S. et al, "Bandwith Extension in CMOS with Optimized On–Chip Inductors," IEEE Journal of Solid–State Circuits, vol. 35, No. 3, Mar. 2000, pp. 0346–355.

(Continued)

*Primary Examiner*—Minsun Oh Harvey
*Assistant Examiner*—Quang Vu
(74) *Attorney, Agent, or Firm*—Blakely, Sokoloff, Taylor & Zafman, LLP

(57) ABSTRACT

A method is described for optimal simultaneous design and floorplanning of integrated circuits. The method is based on formulating the problem as a geometric program, which then can be solved numerically with great efficiency. Prior work discloses the design of many different analog circuit cells such as operational amplifiers, spiral inductors, and LC oscillators which can be cast as geometric programs. The present disclosure adds to this layout floorplanning constraints in posynomial form that can be mixed with design constraints for different analog circuits. This allows the simultaneous design and floorplanning of numerous analog circuits using geometric programming. Thus, the design and floorplanning can be performed optimally in a single step.

24 Claims, 5 Drawing Sheets

OTHER PUBLICATIONS

Kim, Chung–Hwan, et al, "Frequency–Dependent Series Resistance of Monolithic Spiral Inductors," IEEE Microwave and Guided Wave Letters, vol. 9, No. 12, Dec. 1999 pp. 514–516

Hershenson M Delm et al: "Optimal Design Of A CMOS OP–AMP Via Geometric Programming", IEEE Transactions On Computer–Aided Design Of Integrated Circuits and Systems, Jan. 2001, IEEE vol. 20, No. 1, pp. 1–21, Paragraph '007A', Table 1.

Balasa, F:, "Modeling Non–Slicing Floorplans With Binary Trees", 2000 IEEE/ACM International Conference On Computer–Aided Design. ICCAD–2000. San Jose, CA, Nov. 5–9, 2000, IEEE/ACM International Conference On Computer–Aided Design, New York, NY, IEEE, Nov. 5, 2000, pp. 13–16.

Maria Del Mar Hershenson, CMOS Analog Circuit Design Via Geometric Programming, Dissertation submitted to the Department of Electrical Engineering and The Committee On Graduate Studies, Stanford University, Stanford, California, Nov. 1999, Chapter 8, pp. 183–188. Revelent Section 8.2.4, first made available at the Stanford University Library on or about Nov. 17, 2000.

Hershenson, M., et al., "Automated Design of Folded–Cascode Op–Amps with Sensitivity Analysis", pp. 121–124, Electronics, Circuits and Systems, IEEE International Conference on LISBOA, Sep. 7–10, 1998.

Hershenson, M., et al., "GPCAD: A Tool for CMOS Op–Amp Synthesis" 8 pages, Proceedings of the IEEE/ACM International Conference on Computer Aided Design (ICCAD), pp. 296–303, Nov. 1998.

Hershenson, M., et al., "Posynomial models for MOSFETs" 9 pages, Jul. 7, 1998.

Chang, H, et al., "A Top–Down, Constraint–Driven Design Methodology for Analog Integrated Circuits" 6 pages, IEEE 1992 Custom Integrated Circuits Conference.

Chavez, J., et al., "Analog Design Optimization: A Case Study" 3 pages, IEEE, Jan. 1993.

Kortanek, K.O., et al., "An Infeasible interior–point algorithm for solving primal and dual geometric programs" pp. 155–181, Mathematical Programming 76 (1996).

Geilen, G., et al., "Analog Circuit Design Optimization Based on Symbolic Simulation and Simulated Annealing", pp. 707–713, IEEE Journal of Solid–State Circuits, vol. 25, No. 3, Jun. 1990.

Fishburn, J, et al., "TILOS: A Posynomial Programming Approach to Transistor Sizing" pp. 326–328, IEEE, 1985.

Maulik, P., et al., "Integer Programming Based on Topology Selection of Cell–Level Analog Circuits", 12 pages, IEEE Transactions On Computer–Aided Design Of Integrated Circuits And Systems, vol. 14, No. 4, Apr. 1995.

Swings, K., et al., "An Intelligent Analog IC Design System Based On Manipulation Of Design Equations" pp. 8.6.1–8.6.4, IEEE 1990, Custom Integrated Circuits Conference.

Nesterov, Y., et al., "Interior–Point Polynomial algorithms in Convex Programming" 8 pgs., 1994, Society for Industrial and Applied mathematics.

Yang, H.Z., et al., "Simulated Annealing Algorithm with Multi–Molecule: an Approach to Analog Synthesis" pp. 571–575, IEEE, 1996.

Wong, D.F., et al., "Simulated Annealing For VLSI Design" 6 pages, 1998, Kulwer Academic Publishers.

Maulik, P., et al., "Sizing of Cell–Level Analog Circuits Using Constrained Optimization Techniques" pp. 233–241, IEEE Journal of Solid–State Circuits, vol. 28, No. 3, Mar. 1993.

Ochotta, E, et al., "Synthesis of High–Performance Analog Circuits in ASTRX/OBLS" pp. 273–295, IEEE Transactions on Computer–Aided Design of Integrated Circuits And Systems, vol. 15, No. 3, Mar. 1996.

Wright, S., "Primal–Dual Interior–Point Methods" pp. 1–3, http://www.siam.org/books/wright, Printed Aug. 19, 1998.

Shyu, J., et al., "Optimization–Based Transistor Sizing" pp. 400–408, IEEE Journal of Solid–State Circuits, vol. 23, No. 2, Apr. 1998.

Wright, S., "Primal–Dual Interior–Point Methods" 14 pages, 1997, Society for Industrial and Applied Mathematics.

Van Laarhoven, P.J.M., et al., "Simulated Annealing: Theory and Applications" 26 pages, 1987, Kulwer Academic Publishers.

Hershenson, M., et al., "CMOS Operational Amplifier Design and Optimization via Geometric Programming" pp. 1–4, Analog Integrated Circuits, Stanford University.

Aguirre, M.A., et al., "Analog Design Optimization by means of a Tabu Search Approach" pp. 375–378.

Medeiro, F., et al., "A Statistical Optimization–Based Approach for Automated Sizing of Analog Cells", pp. 594–597, Dept. of Analog Circuit Desing.

Spatnekar, S., "Wire Sizing as a Convex Optimization Problem: Exploring the Area–Delay Tradeoff" 27 pages, Dept. of Electrical and Computer Engineering.

Su, H., et al., "Statistical Constrained Optimization of Analog MOS Circuits Using Empirical Performance Models" pp. 133–136.

Vassiliou, I., et al, "A Video Driver System Designed Using a Top–Down, Constraint–Driven Methodology" 6 pages.

Sapatnekar, S, et al., "An Exact Solution to the Transistor Sizing Problem for CMOS Circuits Using Convex Optimization" 35 pages.

* cited by examiner

OPTIMAL SIMULTANEOUS DESIGN AND FLOORPLANNING OF INTEGRATED CIRCUIT

BACKGROUND

The invention relates to computer aided design of integrated circuits, particularly the simultaneous determination for circuit parameters which include boundaries for floorplan layout.

PRIOR ART

One computer aided design (CAD) technique for designing integrated circuits, particularly analog circuits, relies upon geometric programming. In general, posynomial expressions of circuit parameters for a plurality of performance specifications are first developed. These expressions are constrained, typically by optimization values for a selected one or more of the performance specifications. The expressions are then solved using geometric programming. This solution provides a globally optimal design. Among the specified performance criteria are layout area, gate overdrive, minimum power, unity gain bandwith, etc. . . . Dimensional constraints such as symmetry and matching, limits on device size and total area are used. For a discussion of this technology, see *System And Method For Designing Circuits,* Ser. No. 09/123,129, filed Jul. 27, 1998.

The present invention is an extension of this technology which provides simultaneously with the above computation, specific boundaries in the floorplan of the circuit elements in the integrated circuit.

SUMMARY OF THE INVENTION

The present invention is a method for designing an integrated circuit where design parameters for performance specifications are represented by posynomial expressions with constraints and then solved with geometric programming. The present invention provides an improvement where simultaneous determination of the boundaries for circuit elements in a floorplan result. The floorplan is represented as posynomial expressions with constraint on the size of each of the circuit elements. These posynomial expressions are solved using geometric programming thereby providing the boundaries within the floorplan simultaneously with determining the circuit parameters for the performance specifications.

DETAILED DESCRIPTION

Figure 1:
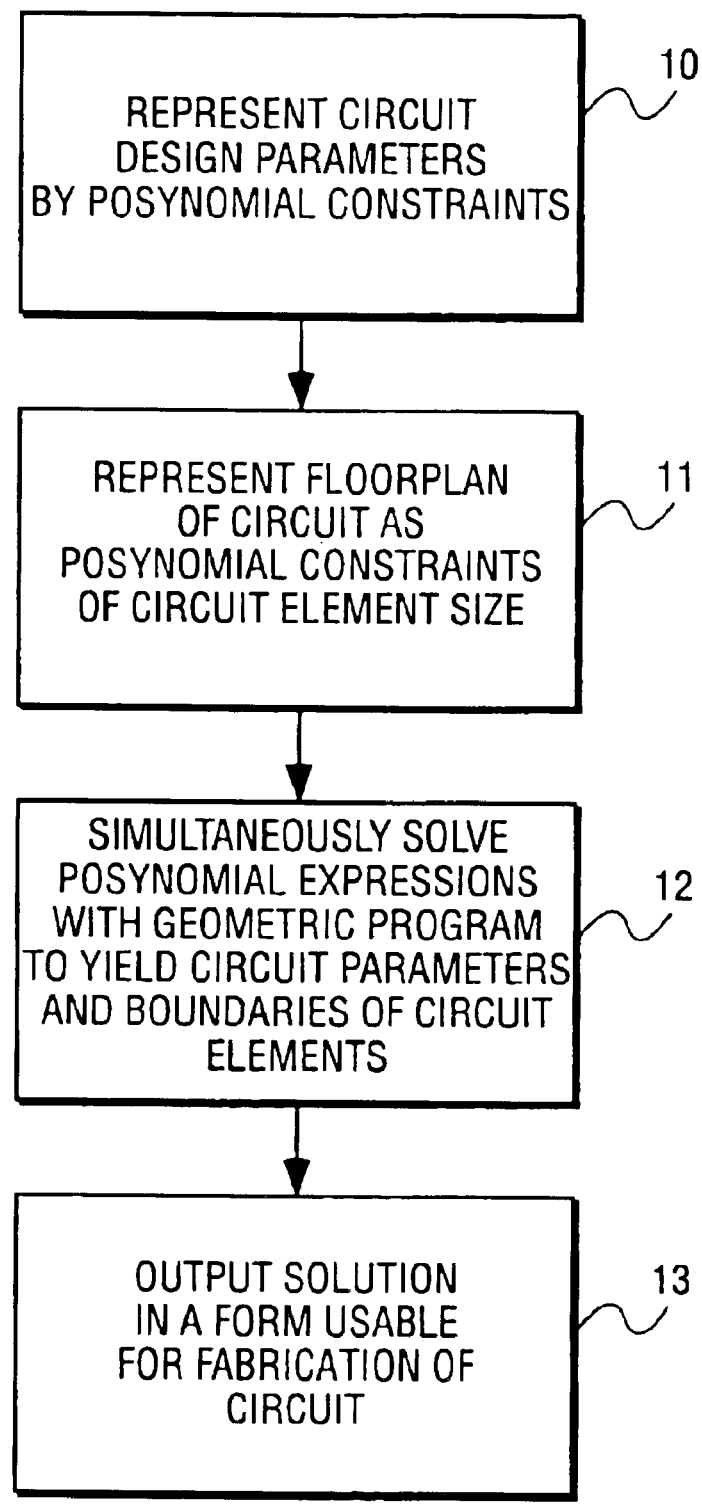
FIG. 1 is a flow diagram showing the steps of the present invention.

A method is described for providing the boundaries forming a floorplan for a circuit. In the following description, numerous specific details are set forth, such as specific circuits to provide a thorough understanding of the present invention. It will be apparent to one skilled in the art that the present invention may be practiced without these specific details. In other instances, well known prior art technique such as solving posynomial expressions using geometric program is not set forth in detail in order not to unnecessarily obscure the present invention.

In the following description, the word "posynomial" expression or equation is used. This term is used to include a monomial expression or equation.

In the prior art, it is known that the design of many different analog circuit cells such as operational amplifiers (op-amps), spiral inductors, and LC oscillators, as well as more complicated analog and mixed circuits, such as phase-lock loops, analog-to-digital and digital-to-analog converters and switched-capacitor filters can be cast as geometric programs. These designs presupposes the active devices are operating in their saturation regions. In this patent, this prior art technology is built upon in that the layout floorplanning constraints for a circuit are set forth in posynomial and hence, can be mixed with design constraints. This allows for the simultaneous design and floorplanning of analog circuits using geometric programming. Consequently, the design and floorplanning can be performed optimally in a single step.

In co-pending application Ser. No. 09/123,129; filed Jul. 27, 1998; entitled *System and Method for Designing Integrated Circuits,* now U.S. Pat. No. 6,269,277, the design techniques for designing for instance, an op-amp is described. In summary, this prior art computer aided design (CAD) system provides for the design and in optimizing of integrating circuits. It results in the automated synthesis of globally optimal circuit designs for a give circuit topology resulting directly from a user defined specification. Generally, the CAD system includes a library of integrated circuit topologies. The performance specifications for the integrated circuit topologies are described as posynomial functions of the design parameters. The performance specifications are combined with user defined design objectives and constraints to form a geometric program. One embodiment reformulates geometric programs as convox optimization problems, i.e. the problem of minimizing a convex function subject to convex inequalities constraints and linear equality constraints. This facilitates globally and efficiently solving geometric programs. New variables $y_1 = \log x_1$ are defined, the logarithm of a polynomial f is taken to get.

$$h(y) = \log(f(e^{y_1}, \ldots, e^{y_n})) = \log\left(\sum_k^t e^{a_k^T y + b_k}\right)$$

where $\alpha_k^T = [\alpha_{1k} \ldots \alpha_{nk}]$ and $b_k = \log c_k$. It can be shown that h is a convex function of the new variable y: for all $y, z \in R^n$ and $0 \leq \lambda \leq 1$ which yields $$h(\lambda y + (1-\lambda)z) \leq \lambda h(y) + (1-\lambda)h(z).$$

The geometric program is then expressed as convex program as follows:

minimize $\log f_0(e^{y_1}, \ldots, e^{y_n})$ subject to $\log f_i(e^{y_1}, \ldots, e^{y_n}) \leq 0, i = 1, \ldots, m$ $\log g_i(e^{y_1}, \ldots, e^{y_n}) = 0, i = 1, \ldots, p.$ This is the so-called exponential form of the geometric program. The convexity of the exponential form geometric program has several important implications including that efficient interior-point methods can be used to solve such geometric programs, and there is a complete and useful duality, or sensitivity theory for them. The efficient procedures for solving geometric programs typically provide the globally optimal results in a matter of seconds in a digital computer. The present invention therefore yields automated synthesis of globally optimal circuit designs for a given circuit topology library, directly from specifications.

With the present invention, the first step includes representing a circuit such as an op-amp as posynomial constraints as is described in the above referenced patent. Step 10 shows this in FIG. 1 under the step "represent circuit design parameters by posynomial constraints."

Unlike the prior art, however, the present invention now represents the floorplan of the circuit such as an op-amp, as polynomial constraints of circuit element size. In effect, the boundaries of the circuit elements forming the circuit such as the transistors in an op-amp, are represented as posynomial expressions with constraints, as will be described.

Next, the expressions both for the floorplan and the performance specifications of the circuit represented by design parameters are solved with a geometric program yielding both the circuit parameters and the boundaries of the circuit elements in the floorplan. This is shown in FIG. 1 as step 12. This can be done generally using a modern workstation in a matter of minutes. Such computation without a modern digital computer could take a lifetime to compete manually.

The results of step 12 are represented in a format which preferably can be readily used by a designer in the layout of the circuit for fabrication as an integrated circuit as shown by step 13. For instance, a computer readable format is provided on a specified grid identifying the circuit elements and their parameters such as the length and width of channels of MOS transistors. In other instances, it may be more desirable to provide a hard copy with the fabrication information. In any event, the solution resulting from the geometric program enables the fabrication of an optimal circuit. In one embodiment, the circuit fabrication data is sent over the Internet to a designer that incorporates the design into an overall chip design. Then the chip incorporating the circuit designed in accordance with the present invention can be fabricated using known processes.

Figure 3:
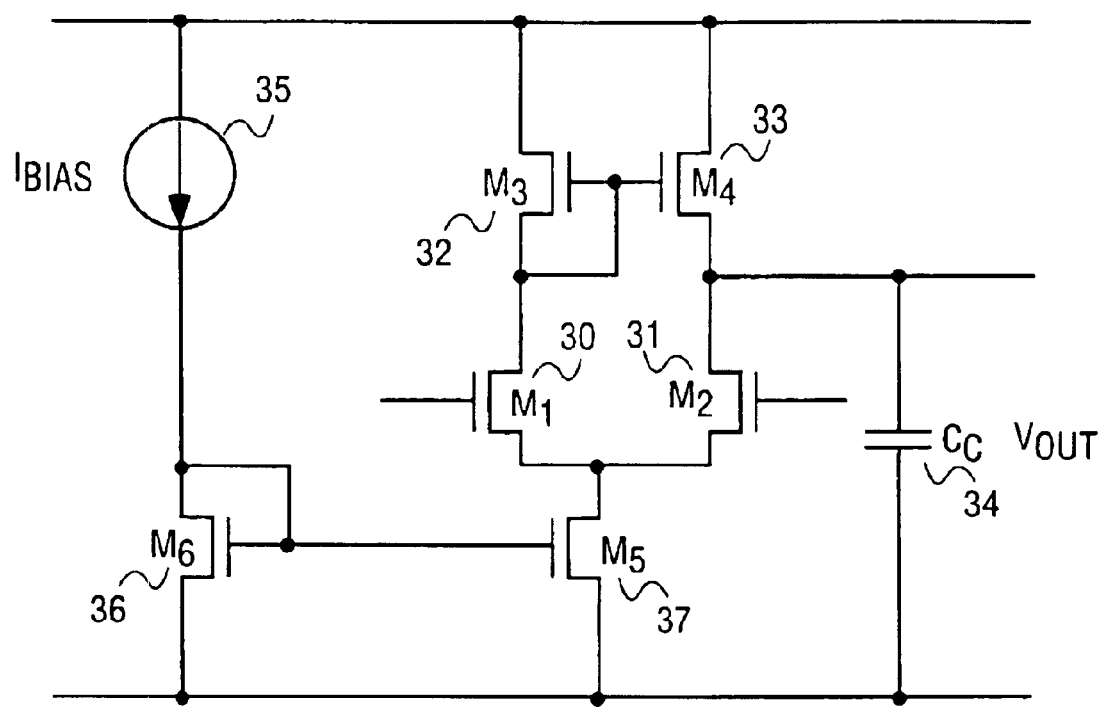
FIG. 3 is a circuit diagram of an integrated circuit.

Consider first the op-amp of FIG. 3. It is fabricated with n-channel, MOS transistors and a passive capacitor 34. The input devices $M_1$ and $M_2$ (transistors 30 and 31) are connected in series with their respective loads $M_3$ and $M_4$ (transistors 32 and 33). The two resultant legs are coupled to $M_5$ (transistor 37). A biasing potential is developed from the constant current source 35 which is coupled to the gate of $M_5$ through $M_6$ (transistor 36). The output capacitor $C_C$ is coupled to the common node between $M_2$ and $M_4$.

Figure 4:
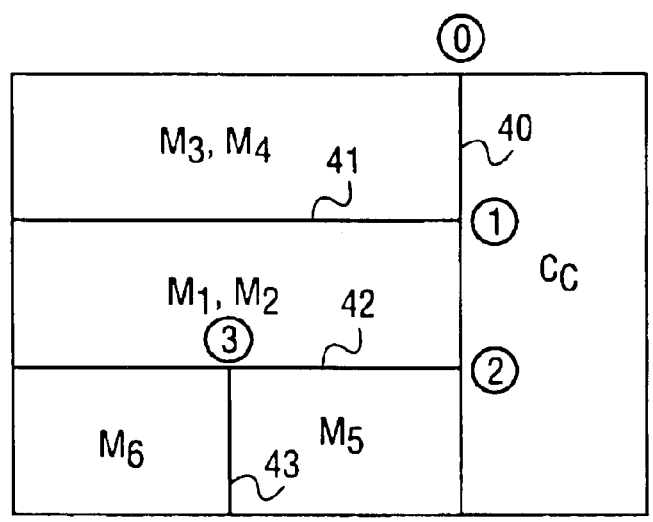
FIG. 4 is a floorplan layout for the circuit of FIG. 3.

A suggested floorplan for this op-amp is shown in FIG. 4. The active loads $M_3$ and $M_4$ of the op-amp are laid out in the upper left hand corner of the floorplan. The compensation capacitor $C_C$ is laid out on the right side of the floorplan. The input transistors $M_1$ and $M_2$ are shown laid out directly below $M_3$ and $M_4$. Finally, $M_5$ and $M_6$ are laid out along side each other in the lower left hand corner of the floorplan. Although the relative location of the different cells (e.g., $M_3$, $M_4$) are fixed in FIG. 4, the exact location of the boundary between the different cells is not fixed. That is, the location of lines 40, 41, 42, and 43 is not fixed within the overall circuit layout.

Given the generic floorplan of the op-amp as shown in FIG. 4, the circuit topology, and required objective parameters and specifications, the goal is to design the circuit (e.g., size the transistors) so that all specifications are met. These objectives and specifications include electrical specification such as gain and bandwidth for op-amps, as well as specifications such as the aspect area of the layout. Minimizing the layout area results in a design with optimal cell packing.

Figure 5:
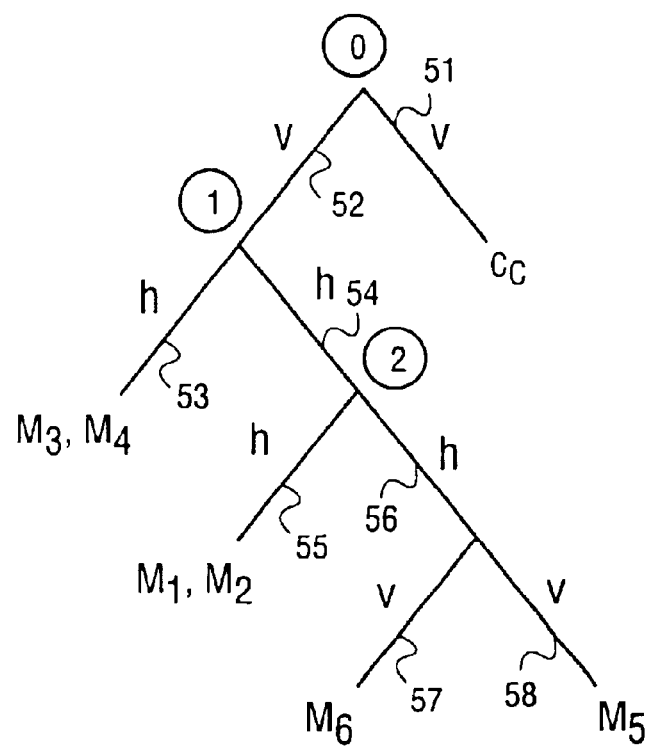
FIG. 5 is a slicing diagram for the floorplan of FIG. 4.

In one embodiment, the floorplan is represented as posynomial constraints of circuit element size using a slicing tree. Referring to FIG. 4, assume that for a first slice, a vertical slice is taken along line 40. The cell on the right (sibling node) is the capacitor $C_C$ and the cell on the left (other sibling node) contains the cells $M_3$, $M_4$; $M_1$, $M_2$; $M_5$; and $M_6$. Referring to FIG. 5, this initial slice is shown beginning at node 0 by the lines 51 and 52. The "V" on these lines indicate a vertical slice. Line 51 is shown ending in the capacitor, whereas line 52 lead to the point for the next slice.

Now, a horizontal slice is made beginning at node 1 along line 41. As shown by line 53, this results in the sibling node, cell $M_3$, $M_4$. Line 54 leads to node 2 where the next slice occurs.

From node 2, an additional horizontal slice is made along line 42 as shown by lines 55 and 56 of FIG. 5. Line 55 ends in the sibling node comprising the transistors $M_1$, $M_2$.

Line 56 includes the two nodes, $M_5$ and $M_6$. Now, an additional vertical slice is made along line 43 as shown by lines 57 and 58 resulting in the sibling nodes, cells $M_5$ and $M_6$.

Suppose that $(x_i, y_i)$ are the horizontal dimension (width) and vertical dimension (height) respectively of the $i^{th}$ cell corresponding to the $i^{th}$ node of the slicing tree shown in FIG. 5. Given the slicing tree, one can write the inequality constraints relating to the $(x_i, y_i)$. For example, at node 0

$$x_1 + x_{cap}(C_c) \le x_0, \qquad (1)$$

$$y_1 \le y_0,$$

$$y_{cap}(C_c) \le y_0,$$

where $x_{cap}(C_C)$ and $y_{cap}(C_C)$ are the width and the height of the capacitor $C_C$ respectively. Or at node 1:

$$x_{mir}(M_3, M_4) \le x_1, \qquad (2)$$

$$x_2 \le x_1,$$

$$y_{mir}(M_3, M_4) + y_2 \le y_1,$$

Figure 2:
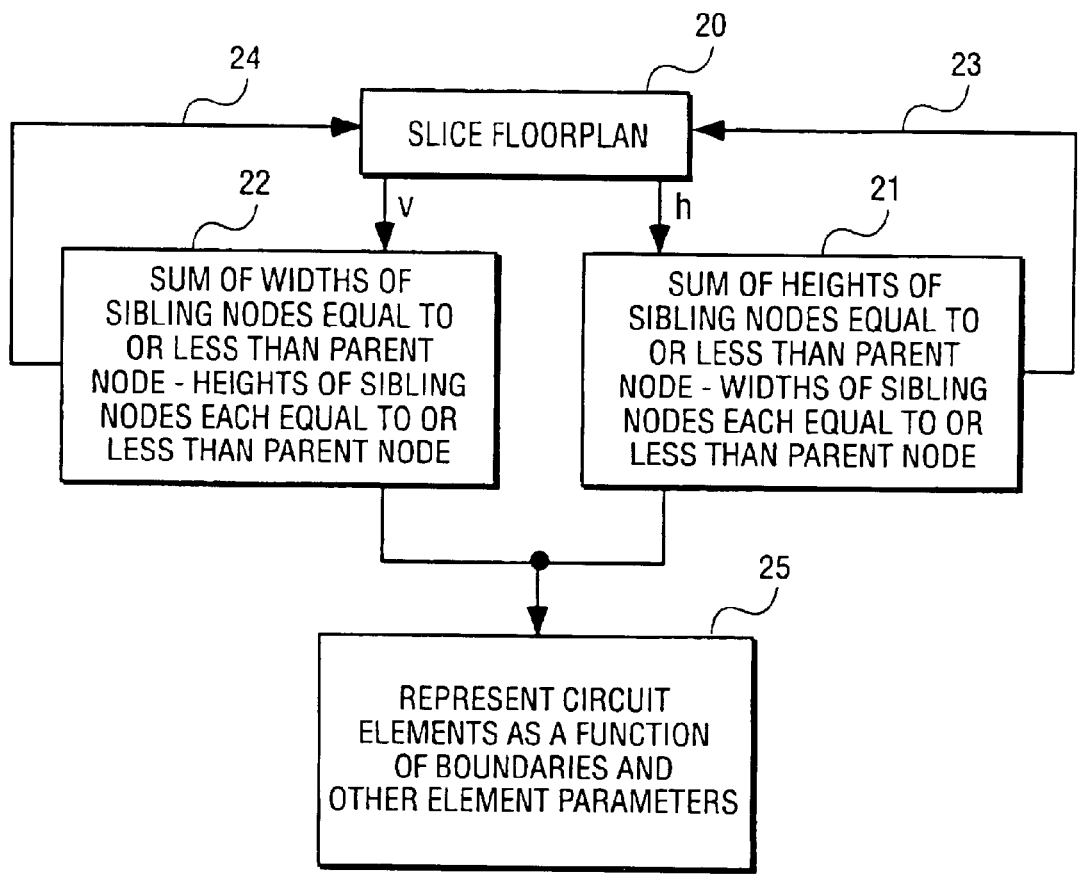
FIG. 2 is a flow diagram showing the method for obtaining the posynomial expressions for each of the circuit element using a slicing technique.

This is summarized in FIG. 2 beginning with block 20. For vertical slices as shown by block 22, the sum of the widths of the sibling nodes are equal to or less than the parent node, while the heights of the sibling nodes are each equal to or less than the parent node. In contrast, for the horizontal slice of block 21, the sum of the heights of the sibling nodes is equal to or less than the parent node, while the widths of the sibling nodes are each equal to or less than the parent node.

As indicated by the lines 23 and 24, slicing continues until the entire circuit is sliced into individual cells for which the boundaries are to be determined. When this is done as shown by block 25, the circuit elements such as the MOS transistors and the capacitor for the op-amp, are represented as a function of boundaries and other element parameters as will be described.

As can be seen, constraints such as shown by equations (1) and (2) are posynomial constraints in cell sizes of the variables $(x_i, y_i)$. There are also posynomial expressions in circuit variables (e.g., W, L of transistors, size of $C_C$, etc. . . . ) because the functions $\chi_i+\chi_{cap}(C_C)$, $y_{cap}(C_C)$, $\chi_{mir}(M_3, M_4)$, and $y_{mir}(M_3, M_4)$ are all posynomial in the circuit variables as will be discussed later.

A constraint on the total area of the circuit to be less than $A_{spec}$, is simply given by:

$$\chi_0 y_0 \leq A_{spec}, \quad (3)$$

which is a monomial inequality in the variables ($\chi_0$, $y_0$). Optimal packing of the cells is achieved by minimizing $\chi_0 y_0$ which is a posynomial function of the variables.

A constraint on the aspect ratio of the circuit to be less than $\kappa_{spec}$ is given by:

$$\chi_0/y_0 \leq \kappa_{1spec}, \quad y_0/\chi_0 \leq \kappa_{2spec} \quad (4)$$

The smallest aspect ratio can be found by minimizing max ($X_0 y_0, y_0 X_0$), which can then be converted into a geometric program (by introducing a slack variable).

Hence, by mixing the layout constraints which are posynomials, such as expressions (1), (2), (3), and (4) with the circuit constraints (as given in the above referenced patent), it is possible to optimally design the circuit and floorplan in one step.

Figure 6:
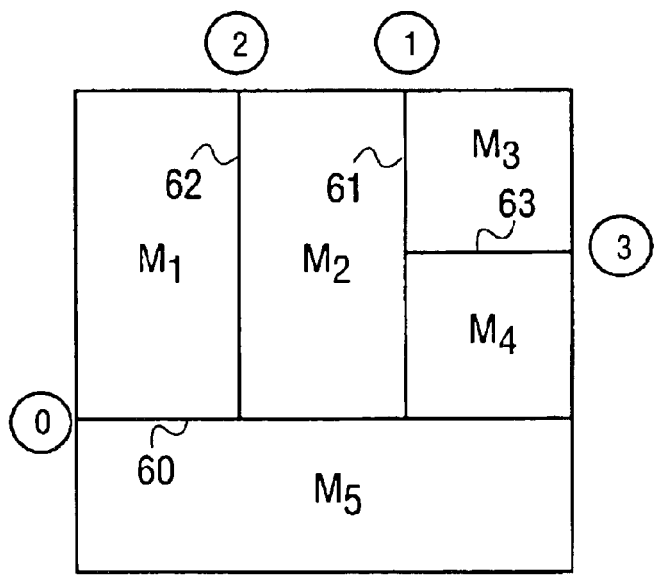
FIG. 6 is a floorplan layout for another integrated circuit.
Figure 7:
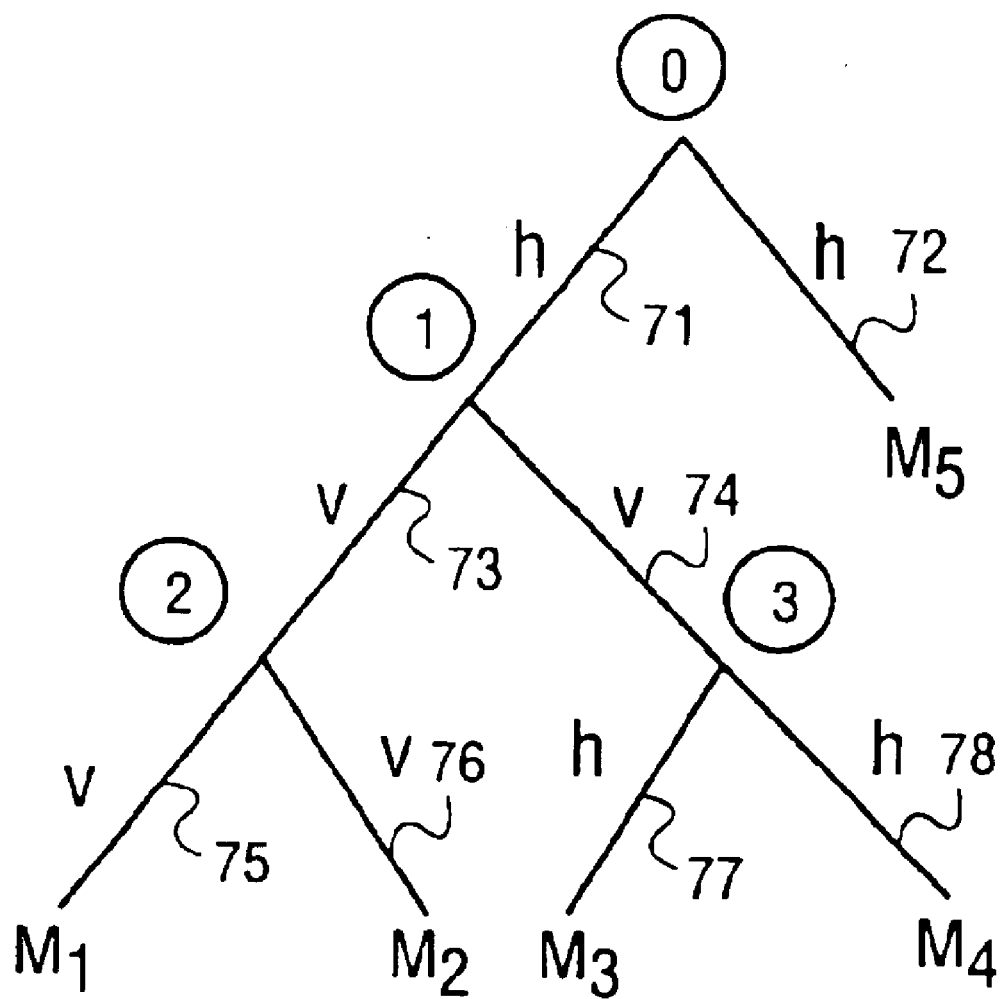
FIG. 7 is a slicing diagram for the floorplan of FIG. 6.

FIGS. 6 and 7 illustrate another example of a circuit floorplan and slicing tree. In FIG. 6, the circuit consists of transistors $M_1$, $M_2$, $M_3$, $M_4$, and $M_5$ with the illustrated topology.

Beginning with node 0, a horizontal slice along line 60 is made as shown by lines 71 and 72 of FIG. 7. Line 72 ends in the cell $M_5$. Line 71 ends in the sibling nodes comprising $M_1$, $M_2$, $M_3$, and $M_4$. Next, at node 1, a horizontal slice along line 61 is made resulting in two sibling nodes: one at line 74 comprising transistors $M_3$ and $M_4$, and the other at line 73 comprising transistors $M_1$ and $M_2$. Now, a vertical slice is made along line 62 from node 2 resulting in cells $M_1$ and $M_2$ shown at the ends of lines 75 and 76 in FIG. 7. Lastly, a horizontal slice is made along line 63 from node 3 resulting in the cells $M_3$ and $M_4$ shown at the ends of lines 77 and 78 of FIG. 7.

Again, with each of the slices, the algorithm of FIG. 2 is used. Specifically, for the vertical slices the sum of the widths of the sibling nodes is equal to or less than the parent node and the heights of the sibling nodes is equal to or less than the parent node. For the horizontal slices, the sum of the heights of the sibling nodes is equal to or less than the parent node and the widths of the sibling nodes are each equal to or less than the parent node. From this, the posynomial expressions for each of the cell sizes can be written.

As mentioned earlier, the constraints represented by equations (1) and (2) above are posynomial constraints in the cell sizes in variables $\chi_i$, $y_i$. For each of the cells, posynomial expressions are used to represent the cell size in terms of the circuit element variables. For instance, in the case of a transistor, the width and length of the transistor.

Consider a MOS transistor M. A first approximation for the width and heights of the MOS is given by:

$$\chi_{nmos}(M)=m_x L, \quad y_{mos}(M)=m_y W,$$

which are monomial expressions in the circuit variables L, W, $m_x$, and $m_y$. Here L and W typically are the critical dimension in a fabrication process and m the number of counts for this dimension. These expressions only consider the active part of the MOS, and, for example, neglect the area of the contacts.

A better expression for the width and heights of M (NMOS in this case) is given by the posynomial equations:

$$\chi_{mos}^x(M) = \left(\frac{drainW}{2} + \frac{sourceW}{2} + L\right)m_x + 2subSp\chi + 2subW + metalW$$

$$y_{mos}^y(M) = m_x W + \frac{m_y}{2}displ_1 + \frac{m_y - 1}{2}displ_2 + 2subSpY + 2subW$$

where
  drain W is the width of the drain
  source W is the width of the source
  metalW is the width of the metal lines around the transistor
  subW is the width of the substrate contacts
  subSpX is the horizontal distance form the transistor to the substrate contacts
  subSpY is the vertical distance from the transistor to the substrate contacts
  $displ_1$ is the distance from a line of fingers to the next, when a source connection is in between
  $displ_2$ is the distance from a line of fingers to the next, when no source connection is in between For other circuit elements such as differential pairs and current mirrors the equation are similar except that $m_x$ is multiplied by 2.

For example, the expression for a spiral inductor is described in "Optimization of Inductor Circuits Via Geometric Programming" *Design Automation Conference*, 1999 proceedings, 36, pps. 994–998 by M. Del Mar Hershenson, et al.

Thus, a method has been described for determining the boundaries in the floorplan of a circuit while simultaneously determining other design parameters using geometric programming.

What is claimed:

1. In a method for designing a circuit where design parameters for performance specifications are represented by posynomial expressions with constraints and solved with geometric programming, an improvement for simultaneously determining the boundaries for circuit elements in the floorplan of the circuit comprising:
   representing the boundaries for circuit elements in the floorplan of the circuit as posynomial expressions with constraints on circuit size;
   simultaneously solving the posynomial expressions for the design parameters and solving the posynomial expressions for the floorplan boundaries on a computer using geometric programming; and
   outputting the results of the solving in a format that allows the results to be used to layout the circuit.

2. The method defined by claim 1 wherein the representation of the floorplan of the circuit includes the slicing of the circuit along the boundaries of the circuit elements.

3. The method defined by claim 1 including using layout constraints for the floorplan.

4. The method defined by claim 3 wherein one of said layout constraints is a limitation on the circuit area.

5. The method defined by claim 4 wherein another of said layout constraints is a limitation on the aspect ratio of the circuit layout.

6. In a method for designing an analog integrated circuit having active circuit elements where design parameters for performance specifications are represented by posynomial expressions with constraints and then solved with geometric programming, an improvement for simultaneously determining the boundaries for the active circuit elements in a floorplan for the integrated circuit, comprising:

representing the floorplan as posynomial constraints of vertical and horizontal dimensions for regions where the active circuit elements are placed;

simultaneously solving the posynomial expressions for the design parameters and the posynomial constraints for the vertical and horizontal dimensions; and outputting the results of the solving in a format usable to layout the integrated circuit.

7. The method defined by claim 6 wherein the integrated circuit is sliced vertically and horizontally along the boundaries of the circuit elements.

8. The method defined by claim 7 wherein for a vertical slice, the resulting first sibling nodes are represented by a sum of horizontal dimensions of the first sibling nodes being equal to or less than a first parent node and which dimensions of the first sibling nodes each being equal to or less then a vertical dimension of the first parent node.

9. The method defined by claim 8 wherein for each horizontal slice, the resulting second sibling nodes are represented by the sum of the vertical dimensions of the second sibling nodes being equal to or less than a second parent node, and the horizontal dimensions of second sibling nodes each being equal to or less than a vertical height of the second parent node.

10. The method defined by claim 9 wherein the circuit elements include MOS transistors where the vertical dimension and horizontal dimension of each of the MOS transistors is represented by a posynomial expression.

11. The method defined by claim 10 wherein the posynomial expression for the vertical and horizontal dimensions of the MOS transistors include process dependant parameters.

12. The method defined by claim defined by claim 11 wherein the design of the analog circuit presupposes that the active circuit elements are operating in their saturation regions.

13. A machine readable medium having stored thereon instructions which when executed by a processor cause the processor to perform in a method for designing a circuit where design parameters for performance specifications are represented by posynomial expressions with constraints and solved with geometric programming and for simultaneously determining the boundaries for circuit elements in the floorplan of the circuit, the method, comprising:

simultaneously solving the posynomial expressions for the design parameters of the circuit and solving posynomial expressions for the floorplan boundaries of the circuit elements using geometric programming, the posynomial expressions for the floorplan boundaries represented as constraints on circuit size; and outputting the results of the solving in a format that allows the results to be used to layout the circuit.

14. The machine readable medium defined by claim 13 wherein the representation of the floorplan of the circuit includes the slicing of the circuit along the boundaries of the circuit elements.

15. The machine readable medium defined by claim 13 including using layout constraints for the floorplan.

16. The machine readable medium defined by claim 15 wherein one of said layout constraints is a limitation on the circuit area.

17. The machine readable medium defined by claim 16 wherein another of said layout constraints is a limitation on the aspect ratio of the circuit layout.

18. A machine readable medium having stored thereon instructions which when executed by a processor cause the processor to perform a method for designing an analog integrated circuit having active circuit elements where design parameters for performance specifications are represented by posynomial expressions with constraints and then solved with geometric programming, and for simultaneously determining the boundaries for the active circuit elements in a floorplan for the integrated circuit, the method comprising:

representing the floorplan as posynomial constraints of vertical and horizontal dimensions for regions where the active circuit elements are placed;

simultaneously solving the posynomial expressions for the design parameters and the posynomial constraints for the vertical and horizontal dimensions; and, outputting the results of the solving in a format usable to layout the integrated circuit.

19. The machine readable medium defined by claim 18 wherein the integrated circuit is sliced vertically and horizontally along the boundaries of the circuit elements.

20. The machine readable medium defined by claim 19 wherein for a vertical slice, the resulting first sibling nodes are represented by a sum of horizontal dimensions of the first sibling nodes being equal to or less than a first parent node and which dimensions of the first sibling nodes each being equal to or less than a vertical dimension of the first parent node.

21. The machine readable medium defined by claim 20 wherein for each horizontal slice, the resulting second sibling nodes are represented by the sum of the vertical dimensions of the second sibling nodes being equal to or less than a second parent node, and the horizontal dimensions of second sibling nodes each being equal to or less than a vertical height of the second parent node.

22. The machine readable medium defined by claim 18 wherein the circuit elements include MOS transistors where the vertical dimension and horizontal dimension of each of the MOS transistors is represented by a posynomial expression.

23. The machine readable medium defined by claim 22 wherein the posynomial expression for the vertical and horizontal dimensions of the MOS transistors include process dependant parameters.

24. The machine readable medium defined by claim 23 wherein the design of the analog circuit presupposes that the active circuit elements are operating in their saturation regions.

* * * * *